United States Patent
Kumamoto

(10) Patent No.: US 7,795,060 B2
(45) Date of Patent: Sep. 14, 2010

(54) LEAD CUTTER AND METHOD OF FABRICATING SEMICONDUCTOR DEVICE

(75) Inventor: Tooru Kumamoto, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/200,574

(22) Filed: Aug. 28, 2008

(65) Prior Publication Data
US 2009/0004827 A1 Jan. 1, 2009

Related U.S. Application Data

(62) Division of application No. 11/727,916, filed on Mar. 29, 2007.

(51) Int. Cl.
*H01L 21/00* (2006.01)
(52) U.S. Cl. .................. 438/33; 438/110; 438/460; 257/E21.214; 257/E21.237
(58) Field of Classification Search .................. 438/33, 438/110, 458, 460; 257/E21.214, E21.237
See application file for complete search history.

(56) References Cited

U.S. PATENT DOCUMENTS

| 4,977,442 A * | 12/1990 | Suzuki et al. ............. 257/670 |
| 6,173,632 B1 * | 1/2001 | Choy ...................... 83/13 |
| 2001/0029821 A1 * | 10/2001 | Yu et al. .................. 83/23 |
| 2005/0212143 A1 * | 9/2005 | King et al. ............... 257/779 |
| 2006/0032834 A1 * | 2/2006 | Iguchi et al. .............. 216/52 |

FOREIGN PATENT DOCUMENTS

| JP | 07-030042 | 1/1995 |
| JP | 07-211838 | 8/1995 |
| JP | 08-172153 | 7/1996 |
| JP | 09-232499 | 9/1997 |
| JP | 2005-209999 | 8/2005 |

\* cited by examiner

*Primary Examiner*—Michelle Estrada
(74) *Attorney, Agent, or Firm*—Young & Thompson

(57) ABSTRACT

Aimed at stably forming sheared surfaces of leads of semiconductor devices, and at raising ratio of formation of plated layers onto the sheared surfaces of the leads, a lead cutter has a die 106, and a cutting punch 110 having a cutting edge at least on the surface facing the die, wherein clearance T between the die 106 and the cutting punch 110 is set within the range from not smaller than 2.3% and smaller than 14.0% of the total thickness of the leads to be cut and plated layers formed on the upper and the lower surfaces thereof.

4 Claims, 15 Drawing Sheets

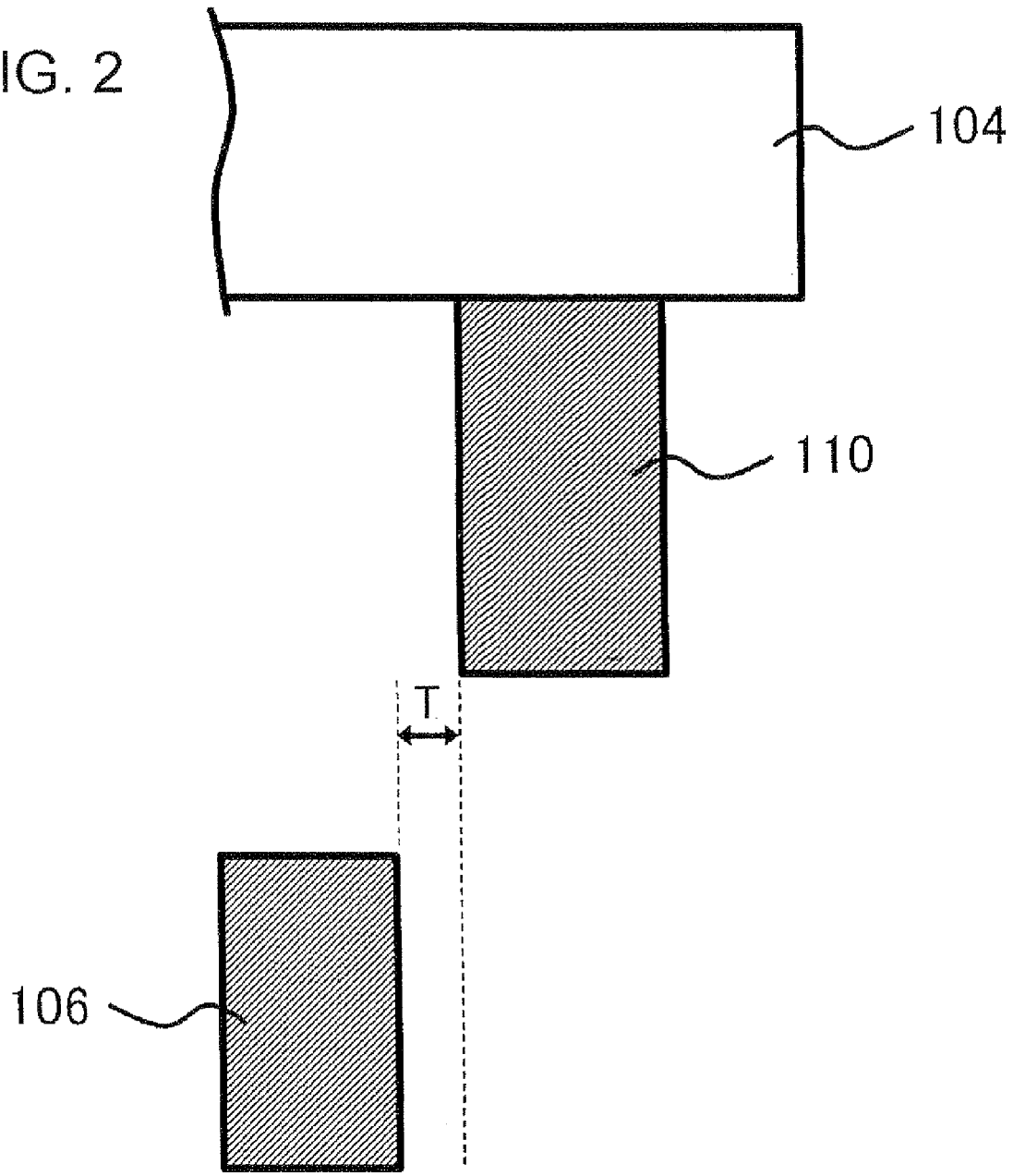

FIG. 13

| CLEARANCE a,b (a=b) μm | CLEARANCE a,b (a=b) (÷ TOTAL THICKNESS)% | TOTAL THICKNESS μm | THICKNESS OF PLATING FILM μm | RATIO OF FORMATION OF (SAGGED SURFACE + SHEARED SURFACE) (÷ TOTAL THICKNESS)% | RATIO OF FORMATION OF PLATING FILM ONTO SHEARED SURFACE | STATE OF BURRING | GENERAL JUDGMENT |
|---|---|---|---|---|---|---|---|
| 0 | 0.0% | 150 | | 100 | × (≦50%) | ○ | × |
| 4 | 2.7% | 150 | | 90~100 | ◎(90~100%) | ◎ | ◎ |
| 8 | 5.3% | 150 | | 80~90 | ◎(90~100%) | ◎ | ◎ |
| 12 | 8.0% | 150 | 1 AND 5 | 60~80 | ◎(90~100%) | ◎ | ◎ |
| 16 | 10.7% | 150 | | 40~60 | ◎(90~100%) | ◎ | ◎ |
| 20 | 13.3% | 150 | | 40 | ◎(90~100%) | ○ | ○ |
| 24 | 16.0% | | | <40 | ◎(90~100%) | × | × |

MARK
◎ : EXCELLENT
○ : GOOD
△ : FAIR (NO IMPROVEMENT)
× : NO GOOD

FIG. 14

| CLEARANCE e μm | CLEARANCE e ($\div$ TOTAL THICKNESS)% | TOTAL THICKNESS μm | THICKNESS OF PLATING FILM μm | RATIO OF FORMATION OF (SAGGED SURFACE + SHEARED SURFACE) ($\div$ TOTAL THICKNESS)% | RATIO OF FORMATION OF PLATING FILM ONTO SHEARED SURFACE | STATE OF BURRING | GENERAL JUDGMENT |
|---|---|---|---|---|---|---|---|
| 0 | 0.0% | 150 |  | 100 | × (≦50%) | ○ | × |
| 4 | 2.7% | 150 |  | 90~100 | ◎(90~100%) | ◎ | ◎ |
| 8 | 5.3% | 150 |  | 80~100 | ◎(90~100%) | ◎ | ◎ |
| 12 | 8.0% | 150 | 1 AND 5 | 70~90 | ◎(90~100%) | ◎ | ◎ |
| 16 | 10.7% | 150 |  | 50~70 | ◎(90~100%) | ◎ | ◎ |
| 20 | 13.3% | 150 |  | 40~50 | ◎(90~100%) | ○ | ○ |
| 24 | 16.0% | 150 |  | <40 | ◎(90~100%) | × | × |

MARK
◎ : EXCELLENT
○ : GOOD
△ : FAIR (NO IMPROVEMENT)
× : NO GOOD

FIG. 15A

| CLEARANCE c μm | CLEARANCE c (÷TOTAL THICKNESS)% | TOTAL THICKNESS μm | THICKNESS OF PLATING FILM μm | RATIO OF FORMATION OF (SAGGED SURFACE + SHEARED SURFACE) (÷TOTAL THICKNESS)% | RATIO OF FORMATION OF PLATING FILM ONTO SHEARED SURFACE | STATE OF BURRING | DEPTH OF SCOOP | GENERAL JUDGMENT |
|---|---|---|---|---|---|---|---|---|
| 0 | 0.0% | 150 | | 90~100 | × (≤50%) | × | ◎ | × |
| 4 | 2.7% | 150 | | 40~60 | ◎(90~100%) | ○ | ◎ | ◎ |
| 8 | 5.3% | 150 | | 40~60 | ◎(90~100%) | ◎ | ◎ | ◎ |
| 12 | 8.0% | 150 | 1 AND 5 | 40~60 | ◎(90~100%) | ◎ | ◎ | ◎ |
| 16 | 10.7% | 150 | | 40~60 | ◎(90~100%) | ◎ | ◎ | ◎ |
| 20 | 13.3% | 150 | | 40~60 | ◎(90~100%) | ○ | ○ | ○ |
| 24 | 16.0% | 150 | | 40~60 | ◎(90~100%) | × | △ | × |

FIG. 15B

| CLEARANCE c μm | CLEARANCE c (÷TOTAL THICKNESS)% | TOTAL THICKNESS μm | THICKNESS OF PLATING FILM μm | RATIO OF FORMATION OF (SAGGED SURFACE + SHEARED SURFACE) (÷TOTAL THICKNESS)% | RATIO OF FORMATION OF PLATING FILM ONTO SHEARED SURFACE | STATE OF BURRING | DEPTH OF SCOOP | GENERAL JUDGMENT |
|---|---|---|---|---|---|---|---|---|
| 0 | 0.0% | 170 | | 90~100 | × (≤50%) | × | ◎ | × |
| 4 | 2.4% | 170 | | 40~60 | ◎(90~100%) | ○ | ◎ | ◎ |
| 8 | 4.7% | 170 | | 40~60 | ◎(90~100%) | ◎ | ◎ | ◎ |
| 12 | 7.1% | 170 | 15 | 40~60 | ◎(90~100%) | ◎ | ◎ | ◎ |
| 16 | 9.4% | 170 | | 40~60 | ◎(90~100%) | ◎ | ◎ | ◎ |
| 20 | 11.8% | 170 | | 40~60 | ◎(90~100%) | ○ | ○ | ○ |
| 24 | 14.1% | 170 | | 40~60 | ◎(90~100%) | × | △ | × |

MARK
◎ : EXCELLENT
○ : GOOD
△ : FAIR (NO IMPROVEMENT)
× : NO GOOD

LEAD CUTTER AND METHOD OF FABRICATING SEMICONDUCTOR DEVICE

The present application is a Divisional of U.S. application Ser. No. 11/727,916, filed on Mar. 29, 2007, which is hereby incorporated by reference in its entirety.

This application is based on Japanese patent application No. 2006-097608 the content of which is incorporated hereinto by reference.

BACKGROUND

1. Technical Field

The present invention relates to a lead cutter and a method of fabricating a semiconductor device.

2. Related Art

Semiconductor devices having a plurality of outer leads on the outer periphery of molding resin encapsulating semiconductor chips are fabricated according to the procedures below. First, a semiconductor chip is mounted on a leadframe, and then molded with resin. The process is then followed by deburring of the molding resin, and surface finishing such as plating if the leadframe is not preliminarily surface-finished. Thereafter, the semiconductor device is cut off from the leadframe. For the case of surface mounting type, after the semiconductor device is cut off from the leadframe, it is subjected to a forming process according to a predetermined dimension of leads. More specifically, the outer leads horizontally projected out are bent downward, and then further bent in the horizontal direction, to thereby form a gull-wing geometry.

The outer leads are fixed to a substrate with the aid of solder fillets, when the semiconductor device is mounted on the substrate or the like. By the way, in some cases of such semiconductor devices, cut portions appeared in the process step of cutting off the semiconductor device from the leadframe may become the end portions of the leads without a further modification. These cases, however, raise difficulty in stably forming the solder fillets, due to influences of conditions of the cut surface of the end portions of the leads.

Japanese Laid Open Patent Publication No. 2005-209999 discloses a configuration of a semiconductor device having a molding resin for encapsulating a semiconductor chip, and a plurality of leads provided to the outer periphery of the molding resin, wherein the end portions of the leads are bent upward by the half die cutting process. It is reported that the solder fillets can be formed on the lower surfaces and the side surfaces including stepped portions of the leads, and can thereby improve adhesiveness of solder to the end portions of the leads.

Japanese Laid-Open Patent Publication No. H9-232499 discloses a configuration in which an inclined surface for reducing the thickness of the lead is formed in the mounting portion, to be placed on the pads, of the outer leads for external connection, formed by cutting with the aid of a dedicated die, and by bending according to a gull-wing form.

Japanese Laid-Open Patent Publication No. H8-172153 discloses a configuration of leads having notched portions formed in the lower surfaces thereof along a cutting line, and by cutting the outer leads along this line, so as to leave a plated film on the end surfaces of the leads with the aid of notched marks. It is reported that this structure makes it possible to leave a plated film on the end surfaces of the outer leads in a reliable manner.

Japanese Laid-Open Patent Publication No. H7-30042 discloses a leadframe configured as having grooves formed by machining from the top side, in the portions thereof which fall on the end portions of the leads after being processed into a lead form. It is reportedly made possible to form the solder fillets on the end surfaces of the leads in a reliable manner with this structure.

Japanese Laid-Open Patent Publication No. H7-211838 discloses a lead cutter for semiconductor device, composed of a die and a punch, configured as setting the blanking clearance between the punch and the die within the range from 14 to 21% of the total thickness of one of the leads and solder layers formed on the upper and the lower surfaces of the lead, disposing the punch as being facing the die, so as to freely movable in the vertical direction. It is reportedly made possible to incur plastic deformation to the solder layer on the upper surface of the leads, so as to form plating sag of the solder layer extending from the upper rim to the lower rim of the cut surfaces with this structure.

However, techniques disclosed in all of Japanese Laid-Open Patent Publication Nos. 2005-209999, H9-232499, H8-172153 and H7-30042 were in need of additional processes for altering geometry of the end portions of the leads. Examples of the necessary processes include etching and coining during manufacturing the leadframe, and preliminary processing in lead cutting. As a consequence, a problem arises in that the cost expands due to increased number of process steps.

In addition, the present inventors found out that it is important to increase the ratio of formation of sheared surface in the cut surface, for the purpose of raising the ratio of formation of plated film on the cut surface of the leads.

SUMMARY OF THE INVENTION

According to the present invention, there is provided a lead cutter comprising a die, and a cutting punch having a cutting edge at least on the surface facing (opposed to) the die, wherein the clearance between the die and the cutting punch is set within the range from not smaller than 2.3% and smaller than 14.0% of the total thickness of one of the leads to be cut and plated layers formed on the upper and the lower surfaces of the lead.

According to the present invention, there is provided also a method of fabricating a semiconductor device comprising:

cutting leads of a semiconductor device, each of the leads having plated layers formed on the upper and the lower surfaces thereof, with a lead cutter including a die, and a cutting punch having a cutting edge at least on the surface facing the die, wherein the clearance between the die and the cutting punch is set within the range from not smaller than 2.3% and smaller than 14.0% of the total thickness of one of the leads to be cut and plated layers formed on the upper and the lower surfaces of the lead.

By adopting this configuration, a sheared surface can stably be formed in the cut surface, and thereby ratio of formation of the sheared surface can be improved. This configuration is also successful in forming a plating film of the plated layer on the surface of the sheared surface, when the leads of the semiconductor device having the plated layers on the upper and the lower surface of the leads are cut, and is consequently successful in raising the ratio of formation of the plating film on the cut surface.

By narrowing the clearance to as small as less than approximately 14% of the total thickness of the leads to be cut and plated layers formed on the upper and the lower surfaces thereof, sagged surface in the cut surface can be minimized, and lateral load possibly exerted to the cutting punch in the lead cutting can be reduced to an almost ignorable level on the design basis. By virtue of this configuration, the lead cutter of the present invention can get rid of a punch guide. For example, if the clearance is set to as large as 20% equivalent to the total thickness of the lead to be cut and the plated layers formed on the upper and lower surfaces thereof, a large sagged surface may be formed in the process of lead cutting before shearing of the leads starts, wherein in this process the punch may be applied with load in the lateral direction, and may be fractured. Therefore, as described in Japanese Laid-Open Patent Publication No. H7-211838, it has conventionally been necessary to provide a punch guide as a countermeasure for the fracture of the punch under lateral load. However, provision of the clearance within the range of the present invention can get rid of the punch guide from the lead cutter, making it possible to simplify the configuration of the lead cutter and to reduce the cost for manufacturing.

In the present invention, the plated layer can be configured by lead-free plating. The plated layer can be configured by nickel/gold, nickel/palladium, or nickel/palladium/gold.

The technique described in Japanese Laid-Open Patent Publication No. H7-211838 is aimed at cutting the leads having the solder layers on the upper and lower surfaces thereof. Conventional lead-containing solder layer is high in viscosity, and therefore has characteristics different from those of lead-free plated layer. For the case of using the lead-free plated layer, influences on the cut surface of the leads differ from those resulted from the solder layer. Investigations by the present inventors revealed that the ratio of formation of the plating film onto the sheared surface reaches as large as 90% or more in most cases when lead-free plated layer is used, if the clearance between the die and the cutting punch is ensured at a predetermined level or above. On the other hand, the ratio of formation of the sheared surface in the cut surface can be raised, by setting the clearance between the die and the cutting punch within the range from not smaller than 2.3% and smaller than 14.0% of the total thickness of the leads to be cut and plated layer formed on the upper and the lower surfaces thereof. As a consequence, also the ratio of formation of the plating film onto the cut surface can be raised.

The present invention is, therefore, successful in stably forming the sheared surface in portions where the leads are cut, and in raising the ratio of formation of the plating film onto the sheared surface.

BRIEF DESCRIPTION OF THE DRAWINGS

The above and other objects, advantages and features of the present invention will be more apparent from the following description taken in conjunction with the accompanying drawings, in which:

FIG. 2 is an enlarged sectional view showing clearance between the cutting punch and the die;

FIG. 13 is a chart showing results of Example 1;

FIG. 14 is a chart showing results of Example 2; and

FIGS. 15A and 15B are charts showing results of Example 3.

DETAILED DESCRIPTION

Figure 1A:
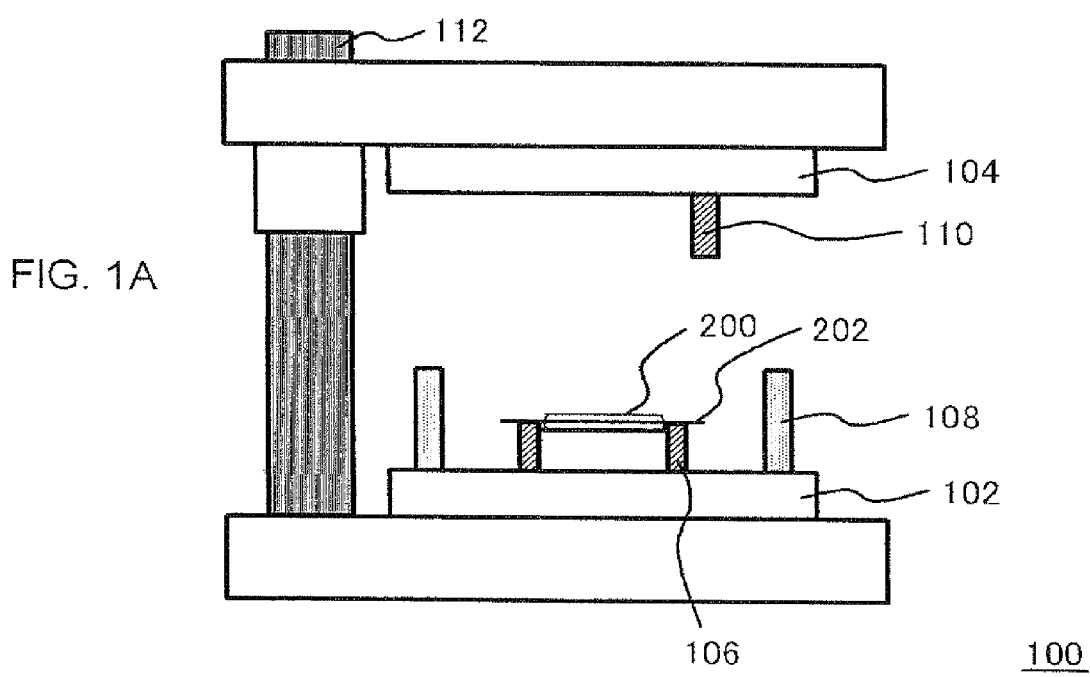
FIGS. 1A and 1B are sectional views showing a configuration of the lead cutter in one embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will describe embodiments of the present invention, referring to the attached drawings. It is to be noted that, in all drawings, any similar constituents will be given with similar reference numerals, so as to avoid repetitive explanation.

FIG. 1 is a sectional view showing a configuration of the lead cutter in this embodiment.

A lead cutter 100 includes a lower die 102, an upper die 104, a die 106 and an upper die holding block 108 attached to the lower die 102, a cutting punch 110 attached to the upper die 104, and a column 112 supporting the upper die 104 as being movable upward and downward. On the die 106, a semiconductor device 200 is placed.

The cutting punch 110 can be configured typically using alloy tool steel, high speed tool steel, cemented carbide or the like. The cutting punch 110 has, on the surface thereof opposed with the die 106, a cutting edge cutting outer leads 202 of the semiconductor device 200. The cutting edge can be provided at least to the edge of the surface of the cutting punch 110 opposed with the die 106. In this embodiment, the entire surface of the cutting punch 110 opposed with the die 106 can be used as the cutting edge. In the cutting punch 110, surface roughness Ra of the cutting edge can be adjusted to 0.05 or less (Ra is arithmetic mean deviation of profile, which represents a mean value of absolute deviation away from an average level). This configuration makes it possible to stably form the sheared surface on the cut surface of the outer lead 202, and to raise the ratio of formation of the plating film onto the sheared surface.

Figure 1B:
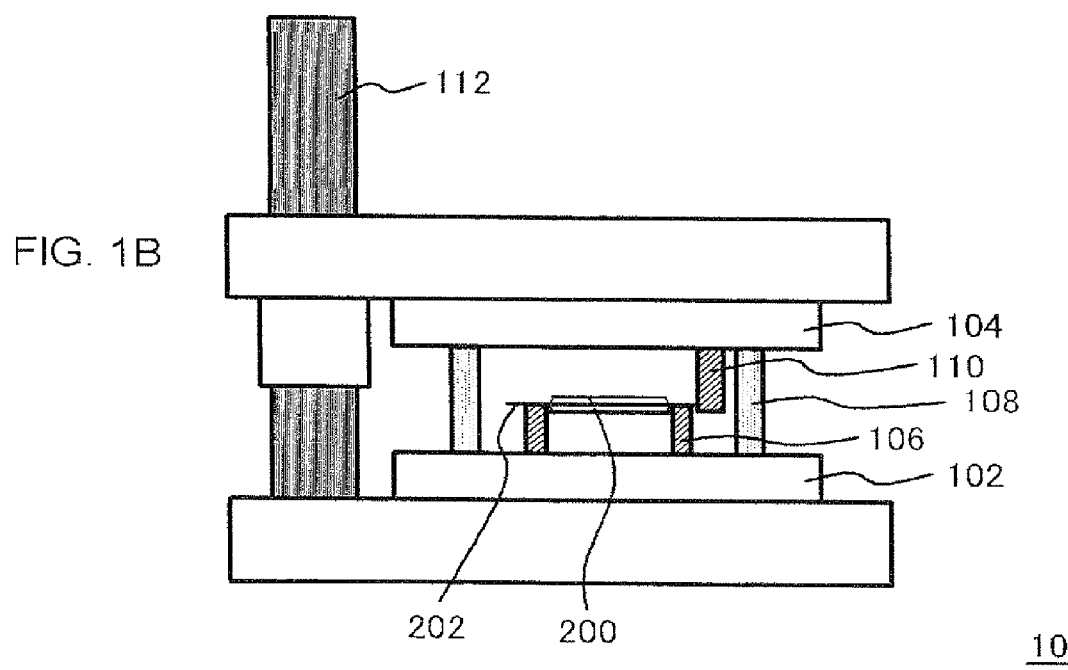

FIG. 1A is a drawing showing a state before the outer lead 202 is cut. FIG. 1B is a drawing showing a state during cutting of the outer lead 202 using the cutting punch 110.

FIG. 2 is an enlarged sectional view showing clearance between the cutting punch 110 and the die 106.

In this embodiment, the clearance T between the die 106 and the cutting punch 110 is set within the range from not smaller than 2.3% and smaller than 14.0% of the total thickness of the outer lead 202 to be cut (total thickness of the lead and the plated layers formed on the upper and the lower surfaces thereof). This configuration makes it possible to stably form the sheared surface on the cut surface of the outer lead 202, and to raise the ratio of formation of the sheared surface. It is also made possible to form the plating film of the plated layer on the surface of the sheared surface, and thereby to raise the ratio of formation of the plating film in the cut surface.

Figure 3:
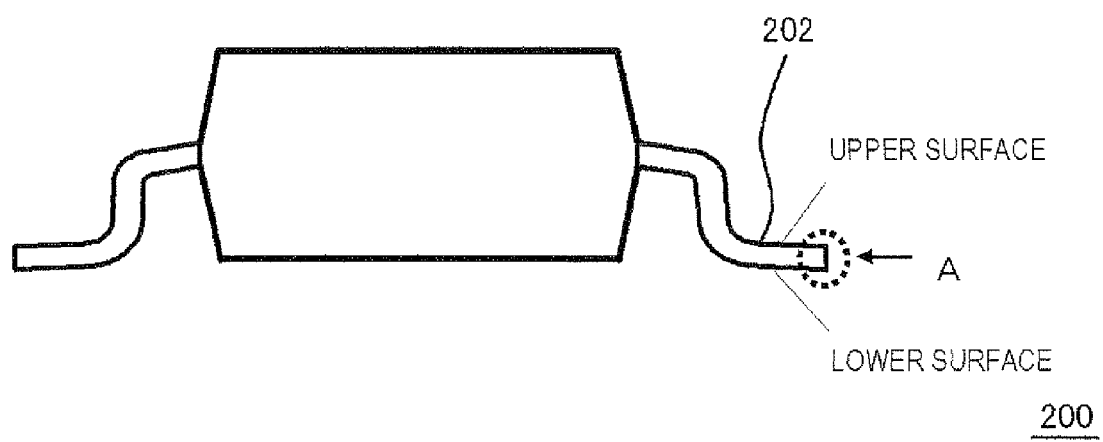
FIG. 3 is a side elevation showing a configuration of a semiconductor device having the outer leads cut in the end portions thereof by the lead cutter in the embodiment of the present invention.

FIG. 3 is a side elevation showing a configuration of a semiconductor device 200 having the outer leads 202 cut in the end portions thereof by the lead cutter 100 of this embodiment.

In this embodiment, the semiconductor device 200 is an IC package having outer leads 200 with a gull-wing geometry. The semiconductor device 200 is configured as being provided with a plurality of outer leads 202 to the flank of a molding resin. The outer leads 202 are formed according to a predetermined dimension.

Figure 4:
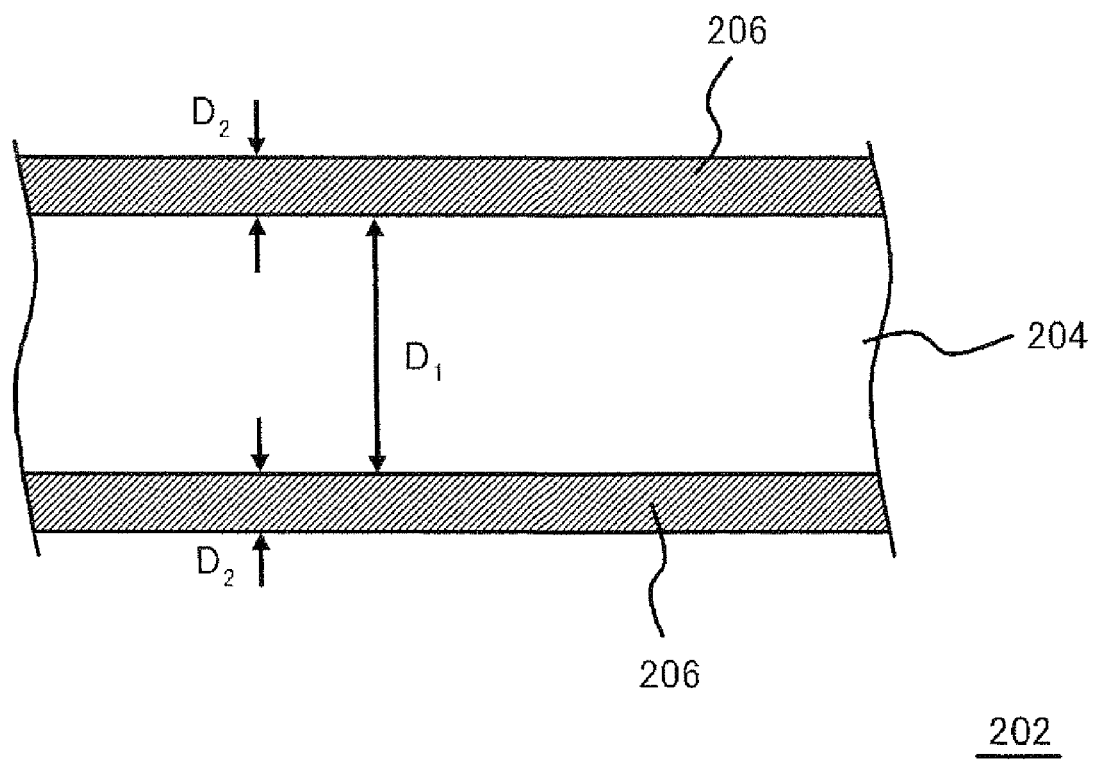
FIG. 4 is a sectional view showing a detail of the outer lead of the semiconductor device shown in FIG. 3.

FIG. 4 is a sectional view showing a detail of the outer lead 202 of the semiconductor device 200 shown in FIG. 3.

The outer lead 202 is configured by a lead portion 204 composed of a lead material, and plated layers 206 formed on the circumference (upper surface, lower surface and side face) of the lead portion 204. The lead material may be copper alloy, Fe—Ni alloy or the like. In this embodiment, thickness $D_1$ of the lead portion 204 may be approximately 0.125 to 0.150 mm, (millimeter), and width may be approximately 0.2 mm. The plated layers 206 are composed of a lead-free (Pb-free) plated film. The plated layers 206 can be configured typically by nickel/gold (alloy of nickel and gold), nickel/palladium (alloy of nickel and palladium), or nickel/palladium/gold (alloy of nickel, palladium, and gold). Thickness $D_2$ of the plated layers 206 may be 5 μm (micrometer) or below.

Figure 5A:
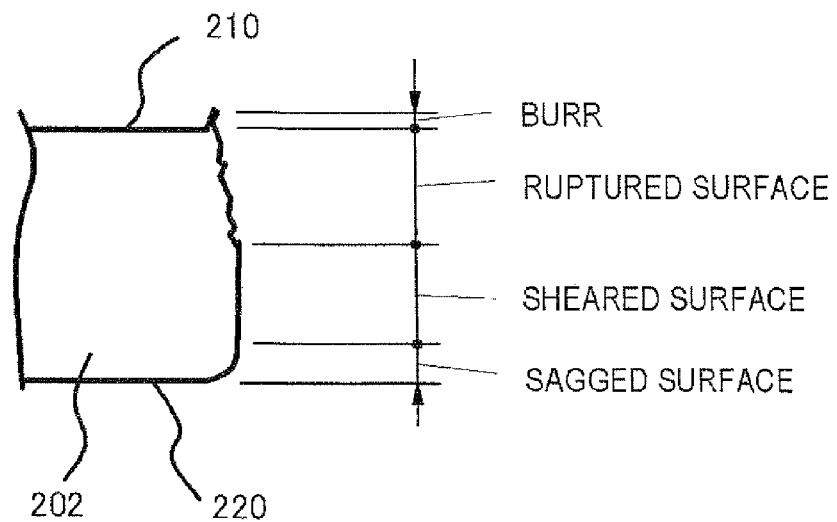
FIGS. 5A and 5B are enlarged views of the end portion of the outer lead of the semiconductor device shown in FIG. 3.
Figure 5B:
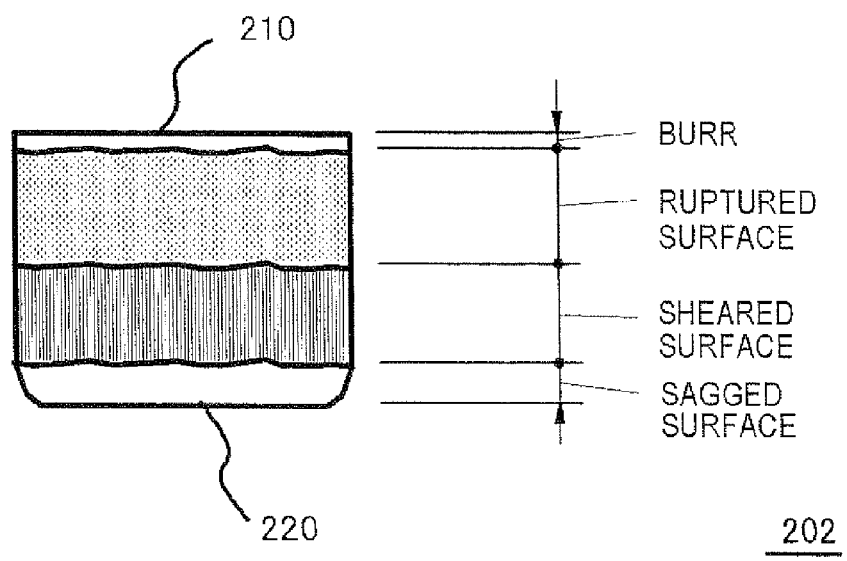

FIGS. 5A and 5B are enlarged views of the cut portion of the outer lead 202 of the semiconductor device 200 shown in FIG. 3. FIG. 5A is an enlarged side elevation of the portion surrounded by the broken line in FIG. 3. FIG. 5B is an enlarged view as viewed from direction "A" in FIG. 3.

In the cut surface of the outer lead 202, appeared are a sagged surface, a sheared surface, a ruptured surface, and a burr aligned in this order as viewed from the bottom side (referred to as sagged surface side 220, whereas the top side is referred to as burr side 210 hereinafter). When the outer lead 202 is cut using the lead cutter 100, the sagged surface, the sheared surface, the ruptured surface and the burr are formed in this order as viewed from the side brought into contact earlier with the cutting punch 110.

It is preferable herein to raise the ratio of areas of the sagged surface and the sheared surface in the cut surface of the outer lead 202, and to raise the ratio of formation of the plating film by the plated layer 206 onto the cut surface. Smaller burr is more preferable. This configuration can prevent increase in electric resistance of the outer lead 202, lowering in the bonding strength, and failure in appearance such as corrosion or the like on the cut surface. This configuration can ensure a sufficient level of adhesiveness of solder for the case where the semiconductor device 200 is mounted on the mounting board, and the outer leads 202 and the mounting board are bonded using the solder fillets. As a consequence, reliability in quality of the semiconductor device 200 can be improved.

Figure 6:
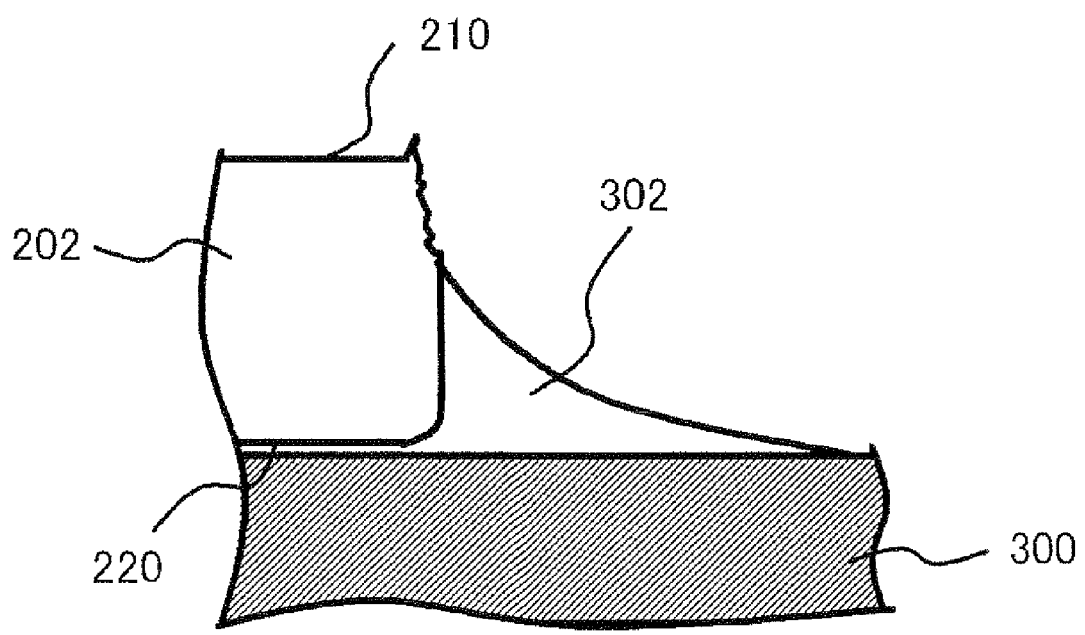
FIG. 6 is a sectional view showing a state of mounting of a semiconductor device on a mounting board, with the outer lead thereof fixed by a solder fillet to the mounting board.
Figure 7A:
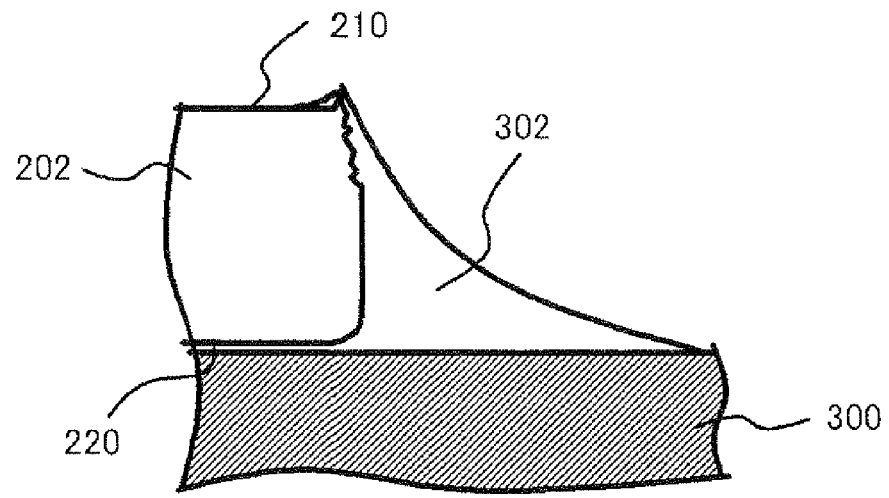
FIGS. 7A and 7B are sectional views showing a state of mounting of other semiconductor devices onto a mounting board, with the outer leads thereof fixed by a solder fillet to the mounting board.
Figure 7B:
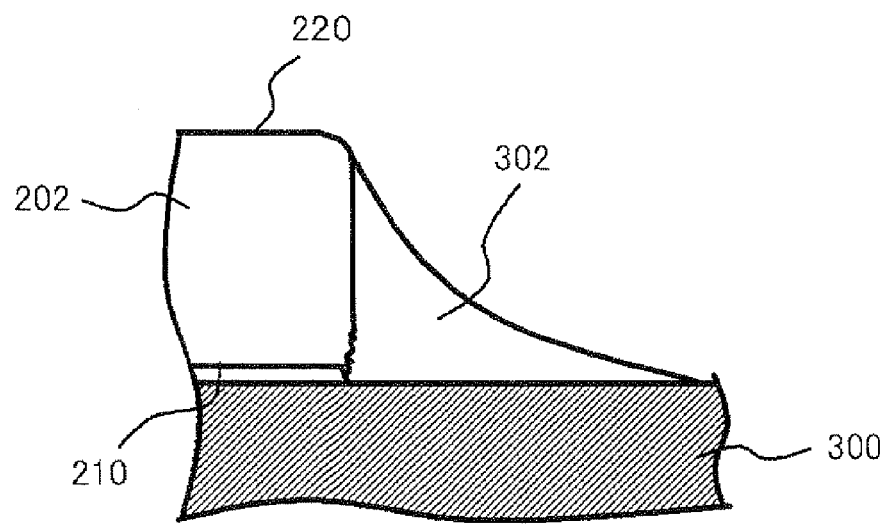

FIG. 6, FIG. 7A and FIG. 7B are sectional views showing states of placement of the semiconductor device 200 on the mounting board 300, with the outer lead 202 thereof fixed by a solder fillet 302 to the mounting board 300.

FIG. 6 shows a state in which the semiconductor device is placed on the mounting board 300, so as to direct the sagged surface side 220 of the outer lead 202 downward. This embodiment can raise the ratio of area of the sheared surface in the cut surface of the outer lead 202, and can further raise therein the ratio of formation of the plating film, so that the solder fillet 302 can stably be formed.

FIGS. 7A and 7B show states in which the entire portion of the cut surface of the outer lead 202 is covered with the solder fillet 302.

FIG. 7A shows a state in which the semiconductor device is placed on the mounting board 300 so that the sagged surface side 220 of the outer lead 202 is directed downward. It is preferable herein to minimize the burr, and to select a highly active flux, used as the solder fillet 302. As a consequence, surface tension of the solder fillet 302 rises during the formation, so that the solder fillet 302 covers also portions up to the burr, and can thereby cover the entire portion of the outer lead 202 with the solder fillet 302.

FIG. 7B is a state in which the semiconductor device is placed on the mounting board 300 so that the burr side 210 of the outer lead 202 is directed downward. It is again preferable to minimize the burr, and to select a highly active flux used as the solder fillet 302. As a consequence, the entire portion of the outer lead 202 can be covered with the solder fillet 302.

Paragraphs below will describe a method of cutting the cuter lead 202.

Figure 8A:
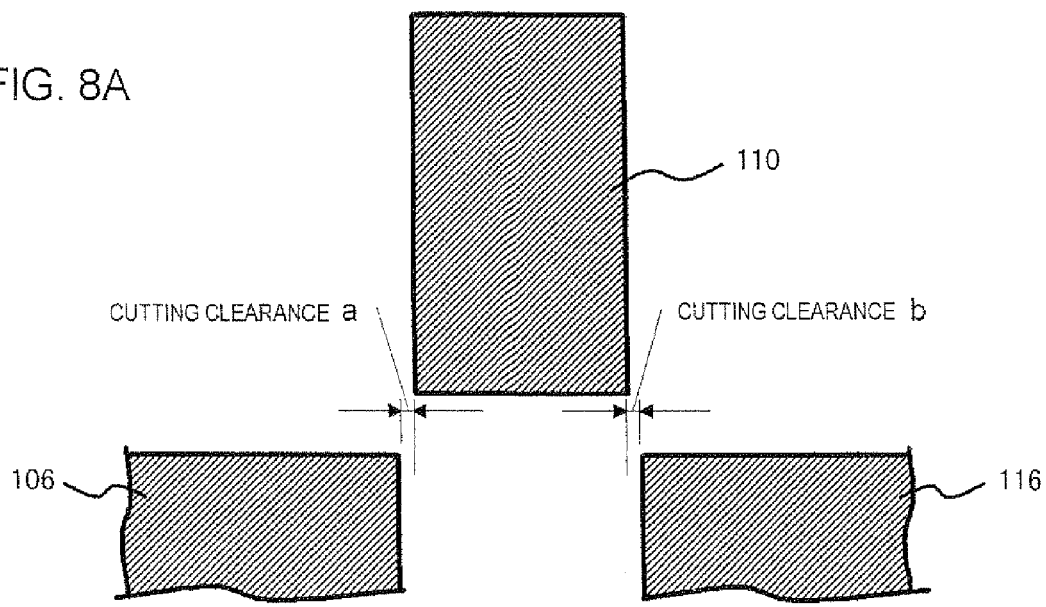
FIGS. 8A and 8B are drawings showing a method of cutting the outer lead, while punching out a portion destined for producing cut debris.
Figure 8B:
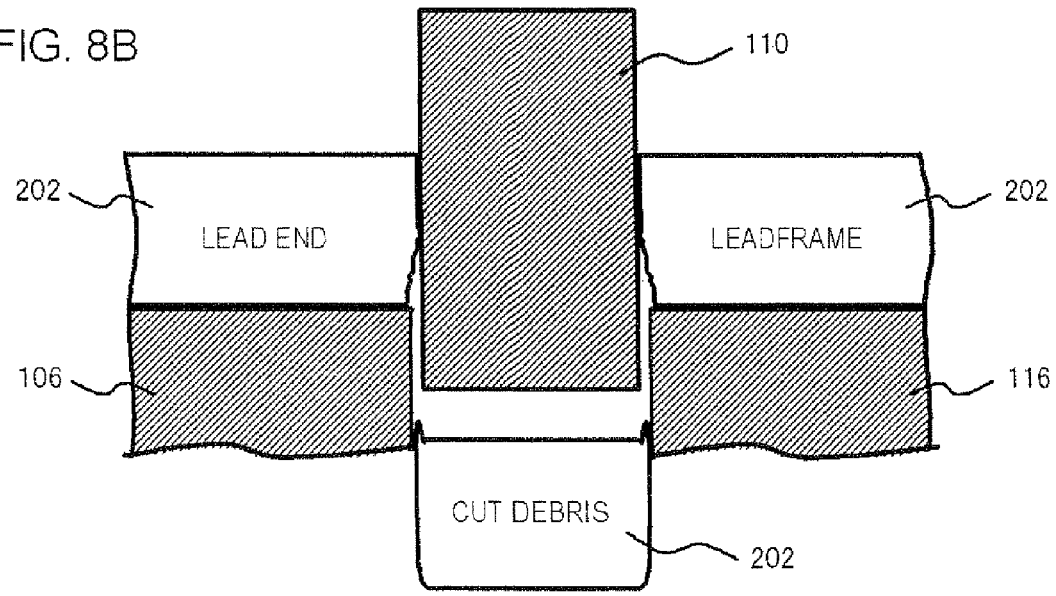

FIGS. 8A and 8B are drawings showing a method of cutting the outer lead 202, while punching out a portion destined for producing cut debris. In this configuration, the lead cutter 100 further includes, in addition to the configuration shown in FIG. 1, a cutoff-side die 116 holding the outer lead 202 on the leadframe side, which is cut off from the semiconductor device 200. The cutting punch 110 further includes a cutting edge provided on the surface facing (opposed to) the cutoff-side die 116. The cutting edge provided on the surface facing the cutoff-side die 116 of the cutting punch 110 may have the same dimension with that of the cutting edge provided on the surface facing (opposed to) the die 106. It is to be noted that surface roughness Ra of the cutting edge provided on the surface facing the cutoff-side die 116 of the cutting punch 110 may be adjusted to 0.05 or below, or not.

The cutting clearance "a" between the die 106 and the cutting punch 110 is set, similarly to T in FIG. 2, so as to fall within the range from not smaller than 2.3% and smaller than 14.0% of the total thickness of the outer lead 202 to be cut (total thickness of the lead and the plated layers formed on the upper and the lower surfaces thereof). Also cutting clearance "b" between the cutting punch 110 and the cutoff-side die 116 is set, similarly to the cutting clearance "a", so as to fall within the range from not smaller than 2.3% and smaller than 14.0% of the total thickness of the outer lead 202 to be cut (total thickness of the lead and the plated layers formed on the upper and the lower surfaces thereof). The cutting clearance "a" and the cutting clearance "b" can be set substantially to the same value. This setting can reduce load possibly applied laterally to the cutting punch 110 in the process of cutting of the outer lead 202 using the cutting punch 110, so as to uniformalize the load applied to the outer lead 202, and can thereby form the sheared surface in the cut surface in a stable manner.

Figure 9A:
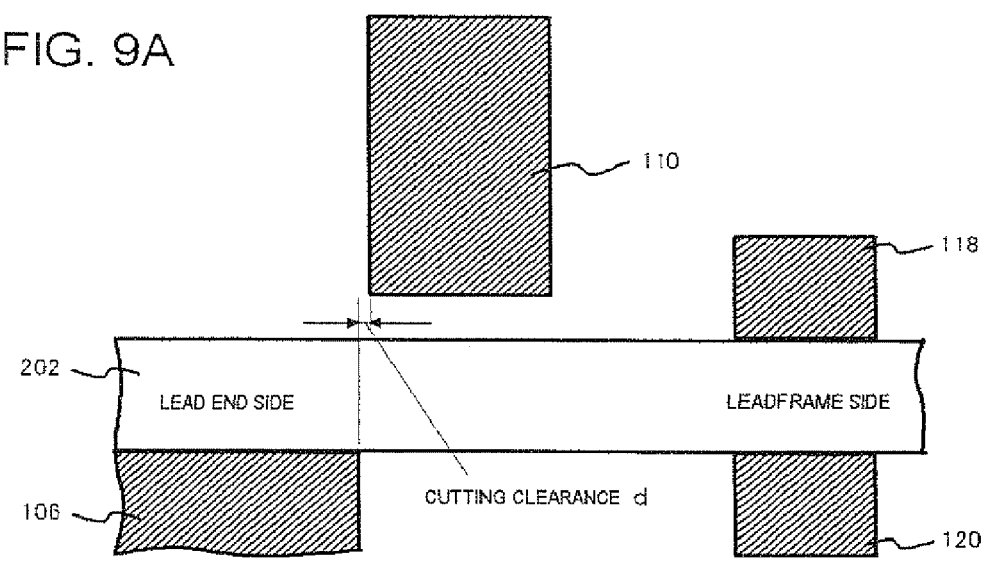
FIGS. 9A to 9C are drawings showing a method of cutting the outer lead, without punching out the portion destined for producing cut debris, while supporting the cut debris.
Figure 9B:
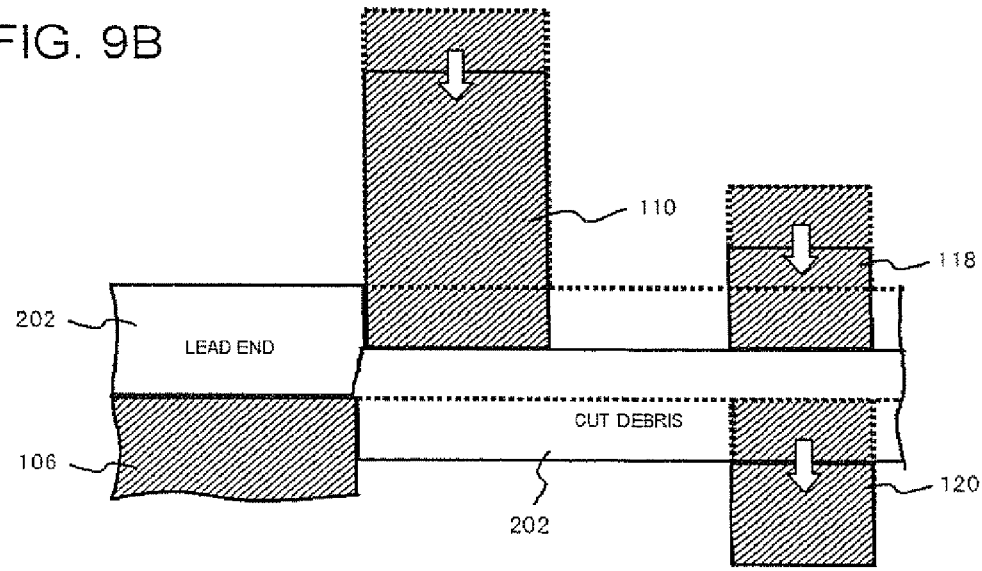
Figure 9C:
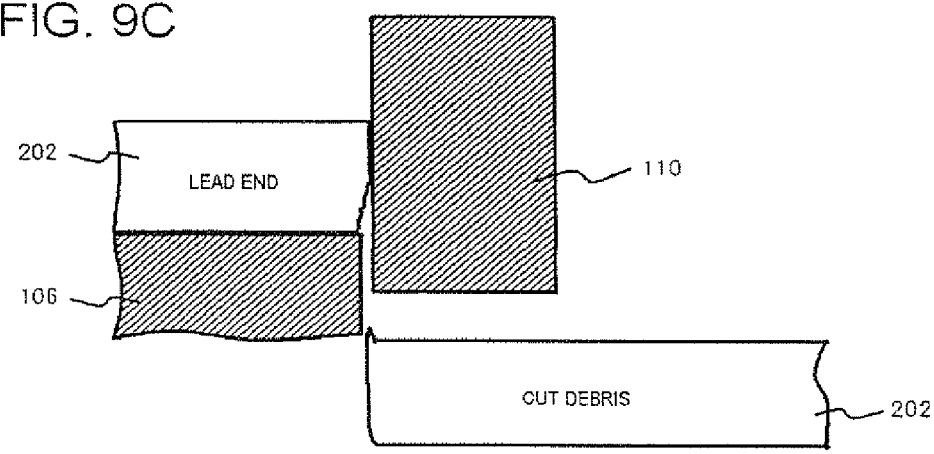

FIGS. 9A to 9C are drawings showing a method of cutting the outer lead 202, without punching out the portion destined for producing cut debris, while supporting the cut debris. In this configuration, the lead cutter 100 further includes, in addition to the configuration shown in FIG. 1, a lead supporting component 118 and a lead supporting component 120 supporting a portion of the outer lead 202 on the leadframe side, from the top and from the bottom, respectively. The lead supporting component 118 and the lead supporting component 120 are provided so as to movable upward and downward, together with the cutting punch 110. Cutting clearance "d" herein between the die 106 and the cutting punch 110 is set, similarly to "T" in FIG. 2, so as to fall within the range from not smaller than 2.3% and smaller than 14.0% of the total thickness of the outer lead 202 to be cut (total thickness of the lead and the plated layers formed on the upper and the lower surfaces thereof).

FIG. 9A is a drawing showing a state before the outer lead 202 is cut. A portion of the outer lead 202 on the leadframe side is fixed by the lead supporting component 118 and the lead supporting component 120. According to this configuration, the cutting punch 110 is moved downward as shown in FIG. 9B to cut the outer lead 202. The lead supporting component 118 and the lead supporting component 120 are moved downward in synchronization with the movement of the cutting punch 110. This configuration can constantly keep the cut debris portion of the outer lead 202 in a horizontal manner, in the process of cutting the outer lead 202 using the cutting punch 110, so that the load possibly applied to the outer lead 202 can be made uniform. As a consequence, the sheared surface can stably be formed in the cut surface.

It is to be noted, that the cutting punch 110 and the lead supporting component 118 may be formed in an integrated manner. Also the lead supporting component 118 and the lead supporting component 120 may be formed in an integrated manner. In this case, provision of a trench to thus-integrated die allows supporting of the outer lead 202 from the upper and from the lower sides thereof.

Figure 10A:
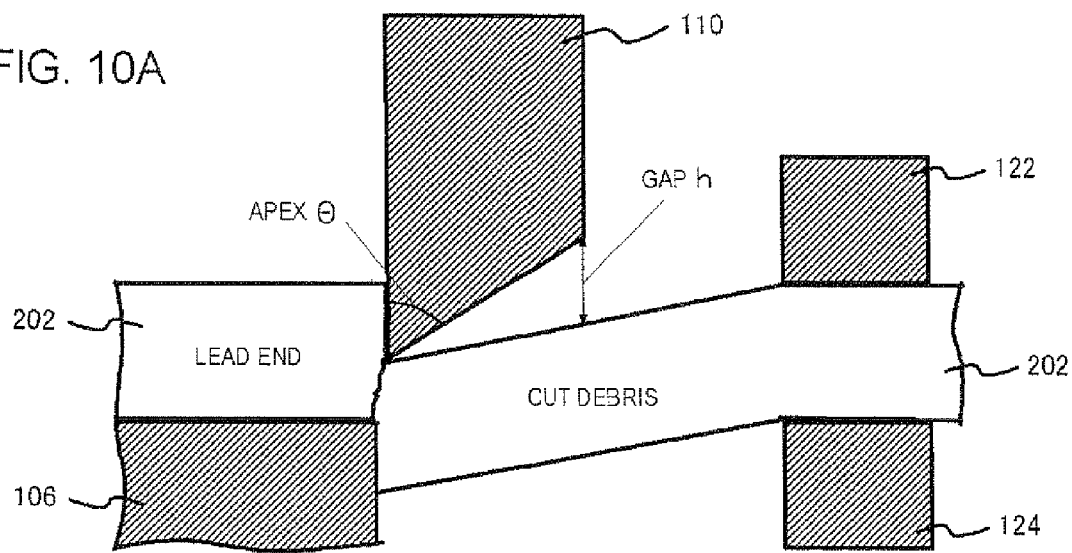
FIGS. 10A and 10B are drawings showing another method of cutting the outer lead, without punching out the portion destined for producing cut debris, while supporting the cut debris.
Figure 10B:
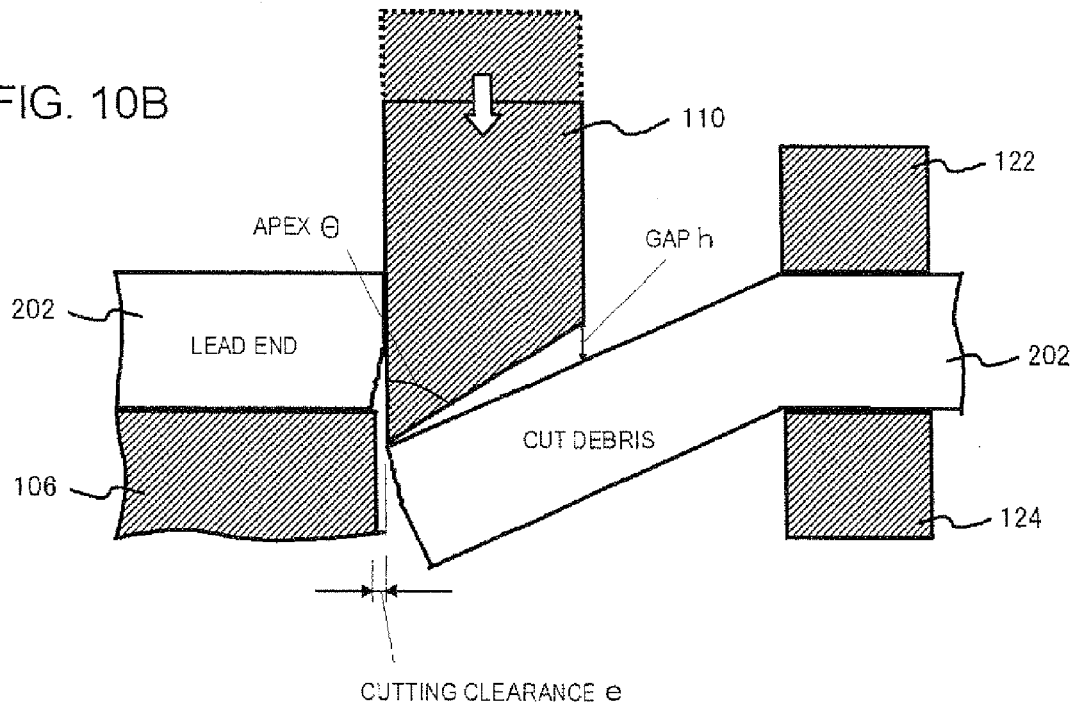

FIGS. 10A and 10B are drawings showing a method of cutting the outer lead 202, without punching out the portion destined for producing cut debris, while supporting the cut debris. In this configuration, the cutting punch 110 has an acute geometry. The lead cutter 100 further include, in addition to the configuration shown in FIG. 1, a lead supporting component 122 and a lead supporting component 124. The lead supporting component 122 and the lead supporting component 124 differ from the lead supporting component 118 and the lead supporting component 120 shown in FIGS. 9A to 9C in that they are not movable. Cutting clearance "e" herein between the die 106 and the cutting punch 110 is set, similarly to "T" in FIG. 2, so as to fall within the range from not smaller than 2.3% and smaller than 14.0% of the total thickness of the outer lead 202 to be cut (total thickness of the lead and the plated layers formed on the upper and the lower surfaces thereof).

FIG. 10A is a drawing showing a state in the process of cutting the outer lead 202. FIG. 10B is a drawing showing a state after the outer lead 202 is cut.

The side face of the end portion on the lead end side of the cutting punch 110 is vertical, and an acute apex Θ is provided to the lead cutting portion thereof. The apex Θ can be set so as to keep a gap "h" between the cutting punch 110 and the cut debris as 0<h, over a period from the start to the end of the cutting of the outer lead 202. This setting is successful in preventing interference between the cutting punch 110 and the cut debris of the outer lead 202 during the cutting process. On the other hand, larger apex Θ (unlimitedly closer to 90°) of the cutting punch 110 can reduce abrasion of the tip of cutting edge of the cutting punch 110, and can thereby elongate service life of the cutting edge. The apex Θ of the cutting punch 110 can be set so as to appropriately satisfy the above-described conditions.

As has been described in the above, the load possibly applied to the outer lead 202 when the outer lead 202 is cut using the cutting punch 110 can be made uniform, by immobilizing the outer lead 202 using the lead supporting component 122 and the lead supporting component 124, so as to prevent the cutting punch 110 from interfering with the cut debris portion of the outer lead 202. As a consequence, the sheared surface can stably be formed.

It is to be noted, that the lead supporting component 122 and the lead supporting component 124 may be formed in an integrated manner. In this case, provision of a trench to thus-integrated die allows supporting of the outer lead 202 from the upper and from the lower sides thereof.

Figure 11A:
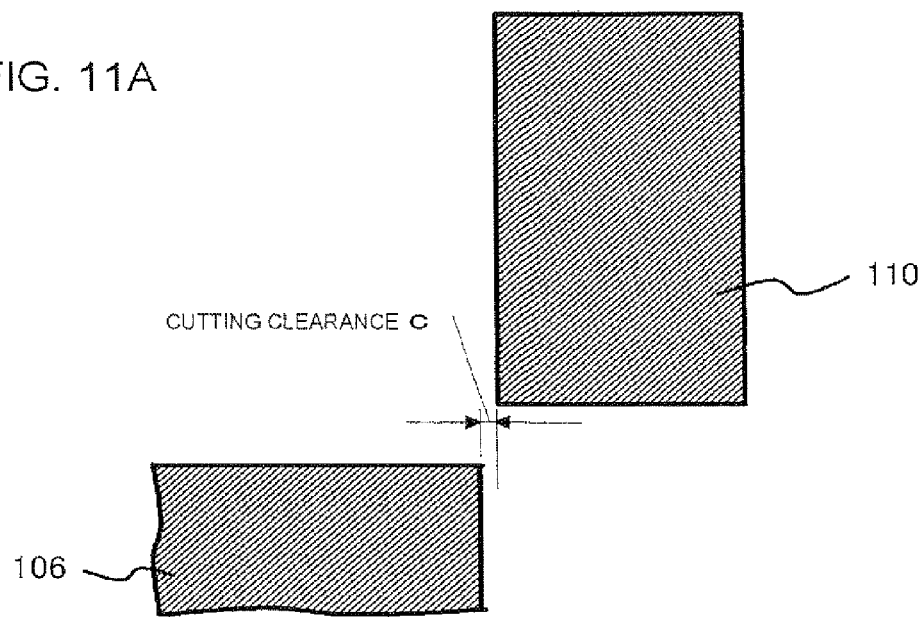
FIGS. 11A and 11B are drawings showing still another method of cutting the outer lead, without punching out the portion destined for producing cut debris, and without supporting the cut debris.
Figure 11B:
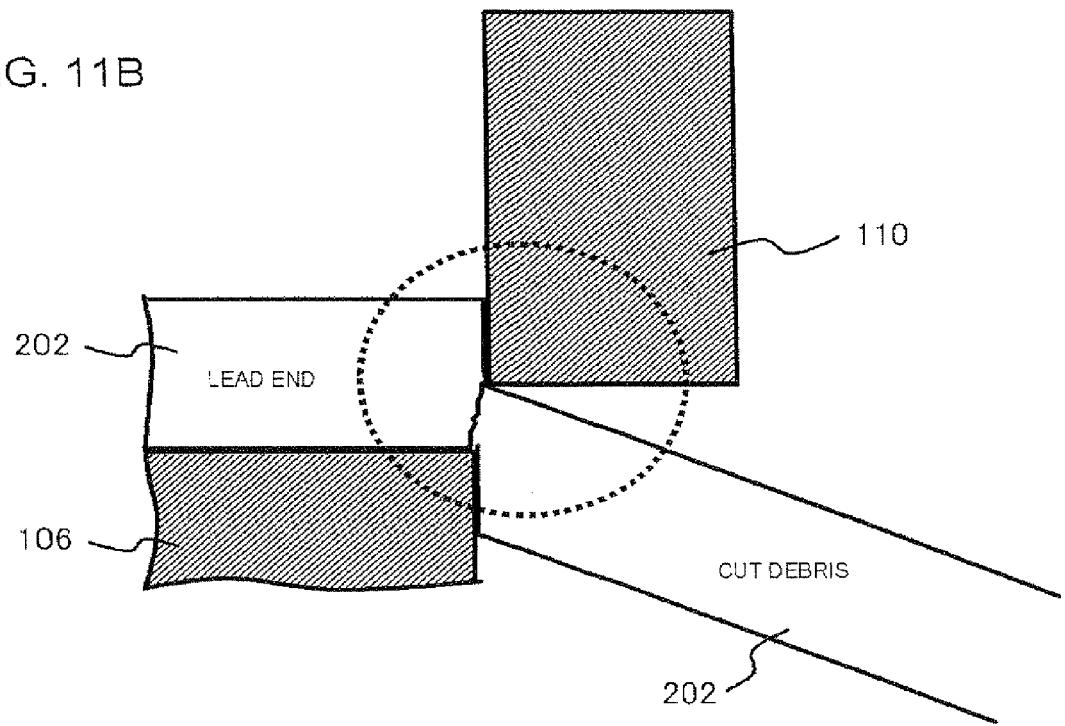

FIGS. 11A and 11B are drawings showing a method of cutting the outer lead 202, without punching out the portion destined for producing cut debris, and without supporting the cut debris. Cutting clearance "c" between the die 106 and the cutting punch 110 is set, similarly to "T" in FIG. 2, so as to fall within the range from not smaller than 2.3% and smaller than 14.0% of the total thickness of the outer lead 202 to be cut (total thickness of the lead and the plated layers formed on the upper and the lower surfaces thereof) (FIG. 11A).

Figure 12:
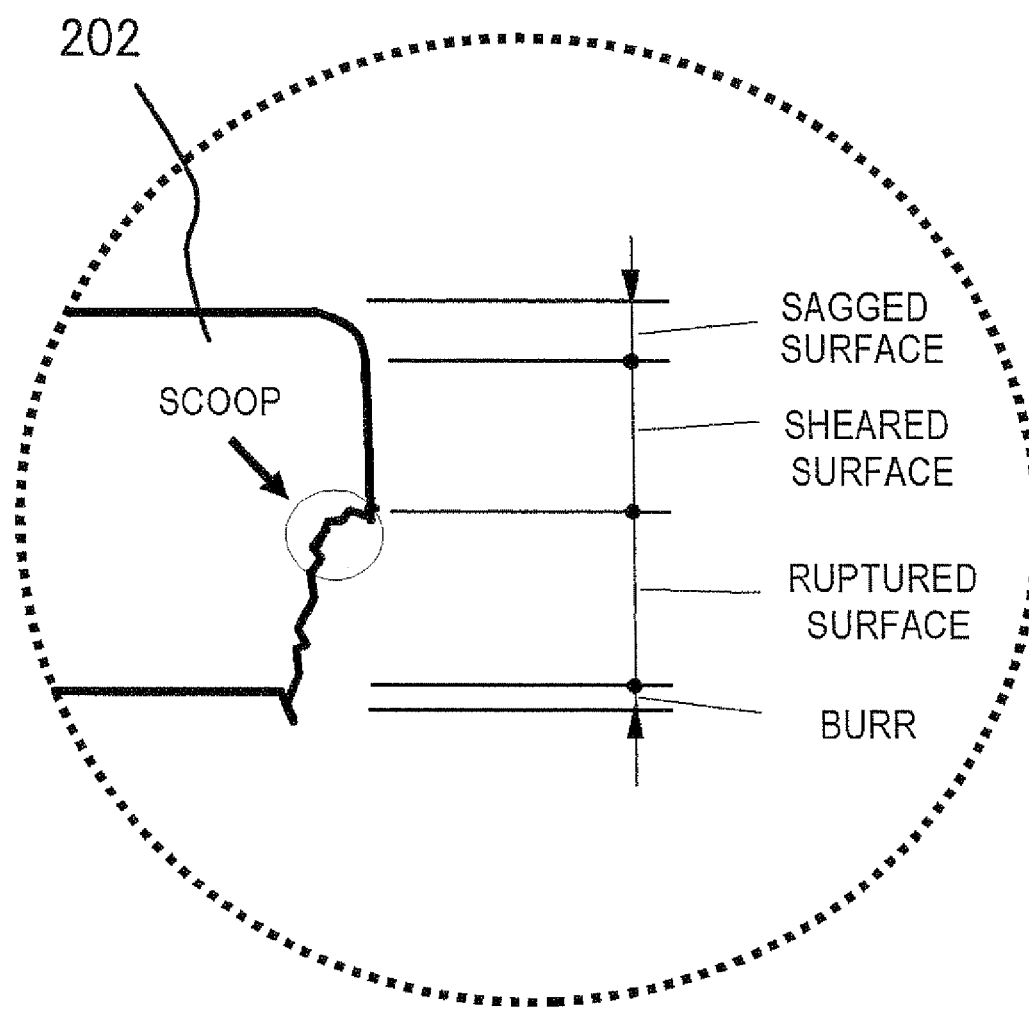
FIG. 12 is a drawing showing an end portion of the outer lead formed by the cutting method shown in FIGS. 11A and 11B.

FIG. 11B is a drawing showing a state in the process of cutting the outer lead 202. In this configuration, the outer lead 202 is processed while keeping the cut debris in a bent state. As a consequence, as shown in FIG. 12, a scoop is produced in the ruptured surface at the tip portion of the outer lead 202. Even in such process step, setting of the cutting clearance "c" as described in the above can suppress generation of the scoop, and can ensure desirable bonding with the solder fillet 302 in the later processes.

EXAMPLES

Example 1

The outer lead 202 was cut according to the method described referring to FIGS. 8A and 8B. Thickness $D_2$ of the plated layer 206 was set to 1 μm or 5 μm, and thickness $D_1$ of the lead portion 204 was determined so as to adjust the total thickness of the lead portion 204 and the plated layers 206 on the upper and lower surfaces thereof to approximately 0.15 mm (150 μm). More specifically, the thickness $D_1$ of the plated layer 206 was set to 0.148 mm when the thickness $D_2$ of the plated layer 206 was 1 μm, and the thickness $D_1$ of the plated layer 206 was set to 0.140 mm when the thickness $D_2$ of the plated layer 206 was 5 μm. A lead-free nickel/palladium/gold plating was used. The cutting clearances "a" and "b" were set equal. Ratios of formation of the (sagged surface+sheared surface) in the cut surface, ratios of formation of the plating film on the sheared surface, and state of generation of the burr were observed, while setting the cutting clearances "a" and "b" (a=b) variably accounting for 0%, 2.7%, 5.3%, 8.0%, 10.7%, 13.3% and 16.0% of the total thickness of the outer lead 202. Results are shown in FIG. 13.

As shown in FIG. 13, the ratio of formation of the sagged surface and the sheard surface in the cut surface was 40%, when the cutting clearance "a" (="b") accounted for 13.3% of the total thickness of the outer lead 202. On the other hand, the ratio of formation of the sagged surface and the sheard surface in the cut surface was less than 40%, when the cutting clearance "a" (="b") accounts for 16% of the total thickness of the outer lead 202. As is obvious from the above, the ratio of formation of the (sagged surface+sheared surface) can be raised to as large as 40% or above, by adjusting the cutting clearances "a" and "b" within the range smaller than 14.0% of the total thickness of the outer lead 202.

For the case where the cutting clearance "a" (="b") accounts for 2.7% of the total thickness of the outer lead 202, the ratio of formation of the plating film onto the sheared surface was found to reach 90% to 100%. By adjusting the cutting clearance "a" (="b") to 2.3% or more of the total thickness of the outer lead 202, the ratio of formation of the plating film onto the sheared surface could be raise to as much as 90% or more. Further by adjusting the cutting clearance "a" (="b") to less than 14.0% of the total thickness of the outer lead 202, also the burr was successfully prevented from generating, and the cut surface was kept in a desirable condition. Based on these findings, the cutting clearance "a" (="b") set within the range from not smaller than 2.3% and smaller than 14.0% of the total thickness of the outer lead 202 can ensure a desirable condition of the cut surface. As a consequence, the state of bonding with the solder fillet 302 can be improved in the later processes. Moreover, by setting the clearance "a" (="b") within the range from 2.3% to 11%, both ends inclusive, of the total thickness of the outer lead 202, the ratio of formation of the (sagged surface+sheared surface) in the cut surface can be raised to as large as approximately 50% or more, so as to further improve the geometry of the cut surface.

Example 2

The outer lead 202 was cut according to the method described referring to FIGS. 10A and 10B. The outer lead to be cut was same as that in Example 1. Ratios of formation of the (sagged surface+sheared surface) in the cut surface, ratios of formation of the plating film on the sheared surface, and state of generation of the burr were observed, while setting the cutting clearance "e" variably accounting for 0%, 2.7%, 5.3%, 8.0%, 10.7%, 13.3% and 16.0% of the total thickness of the outer lead 202. Results are shown in FIG. 14.

As shown in FIG. 14, the ratio of formation of the (sagged surface+sheared surface) in the cut surface could be raised to as high as 40% or more, by adjusting the cutting clearance "e" to less than 14.0% of the total thickness of the outer lead 202. By adjusting the cutting clearance "e" to 2.3% or more of the total thickness of the outer lead 202, the ratio of formation of the plating film onto the sheared surface could be raised to as high as 90% or above. Moreover, by adjusting the cutting clearance "e" to less than 14.0% of the total thickness of the outer lead 202, also the burr was successfully prevented from generating, and the cut surface was kept in a desirable condition. Based on these findings, the cutting clearance "e" set within the range from not smaller than 2.3% and smaller than 14.0% of the total thickness of the outer lead 202 can ensure a desirable condition of the cut surface. As a consequence, the state of bonding with the solder fillet 302 can be improved in the later processes. Moreover, by setting the clearance "e" within the range from 2.3% to 11%, both ends inclusive, of the total thickness of the outer lead 202, the ratio of formation of the (sagged surface+sheared surface) in the cut surface can be raised to as large as approximately 50% or more, so as to further improve the geometry of the cut surface.

Example 3

The outer lead 202 was cut according to the method described referring to FIGS. 11A and 11B. The outer lead to be cut was same as that in Example 1. Ratios of formation of the (sagged surface+sheared surface) in the cut surface, ratios of formation of the plating film on the sheared surface, state of generation of the burr, and depth of scoop were observed, while setting the cutting clearance "c" variably accounting for 0%, 2.7%, 5.3%, 8.0%, 10.7%, 13.3% and 16.0% of the total thickness of the outer lead 202. Results are shown in FIG. 15A.

As shown in FIG. 15A, by adjusting the cutting clearance "c" to 2.3% or more of the total thickness of the outer lead 202, the ratio of formation of the plating film onto the sheared surface could be raised to as high as 90% or above. In this Example, all cases having the cutting clearance "c" set to 2.3% or above of the total thickness of the outer lead 202 resulted in the ratio of formation of the (sagged surface+sheared surface) in the cut surface, constantly within the range from 40% to 60%. In this Example, smaller cutting clearances "c" resulted in lower ratios of formation of the (sagged surface+sheared surface), as compared with the results obtained in Example 1 and Example 2. On the other hand, by adjusting the cutting clearance "c" not smaller than 2.3% and smaller than 14.0% of the total thickness of the outer lead 202, also the burr was successfully prevented from generating, and the cut surface was kept in a desirable condition. Moreover, adjustment of the cutting clearance "c" to less than 14.0% of the total thickness of the outer lead 202 was successful in reducing the depth of scoop. Based on these findings, the cutting clearance "e" set within the range from not smaller than 2.3% and smaller than 14.0% of the total thickness of the outer lead 202 can ensure a desirable condition of the cut surface. As a consequence, the state of bonding with the solder fillet 302 can be improved in the later processes.

In this Example, ratios of formation of the (sagged surface+sheared surface) in the cut surface, ratios of formation of the plating film on the sheared surface, state of generation of the burr, and depth of scoop were observed, while setting the cutting clearance "c" variably accounting for 0%, 2.7%, 5.3%, 8.0%, 10.7%, 13.3% and 16.0% of the total thickness of the outer lead 202, when the thickness $D_2$ of the plated layer 206 on the outer lead 202 is set to 15 μm, and the total thickness of the lead portion 204 and the plated layers 206 on the upper and lower surfaces thereof is set to 0.17 mm (170 μm). Results are shown in FIG. 15B. Also in these cases, the cut surface can be kept in a desirable condition, by adjusting the cutting clearance "c" to not smaller than 2.3% and smaller than 14.0% of the total thickness of the outer lead 202. As a consequence, the state of bonding with the solder fillet 302 can be improved in the later processes.

Also by the method of cutting described referring to FIGS. 9A to 9C, the cut surface could be kept in a desirable condition, by adjusting the cutting clearance "d" to not smaller than 2.3% and smaller than 14.0% of the total thickness of the outer lead 202, similarly to as in Example 1 and Example 2.

Based on these results, it is concluded that, by adjusting the cutting clearance between the die 106 and the cutting punch 110 so as to fall within the range from not smaller than 2.3% and smaller than 14.0% of the total thickness of the outer lead 202, the cut surface can be kept in a desirable condition. In addition, by adjusting the cutting clearance within the above-described range, by appropriately setting methods of supporting the outer lead 202 in the process of cutting the outer lead 202, the sheared surface can more stably be formed in the cut surface of the outer lead 202, so that the ratio of formation of the plating film on the cut surface can consequently be improved.

According to the method of cutting lead of this Example, (i) stable formation of the sheared surface, (ii) improvement in the ratio of formation of the sheared surface, and (iii) stable formation of the plating film onto the sheared surface can be achieved by setting the cutting clearance in the process of cutting the leads, method of supporting the leads, conditions of the side faces of the punch and so forth as process conditions, without altering geometry of the end portion of the leads, so that the state of formation of the solder fillet at the end portions of the leads can be improved and stabilized in the process of manufacturing semiconductor devices.

The foregoing paragraphs have described embodiments of the present invention referring to the attached drawings, wherein these embodiments are merely for those of exemplary purposes, allowing the present invention to adopt any other configurations other than those described in the above.

It is apparent that the present invention is not limited to the above embodiment, that may be modified and changed without departing from the scope and spirit of the invention.

What is claimed is:

1. A method of fabricating a semiconductor device comprising:

cutting leads of a semiconductor device, each of said leads having plated layers formed on the upper and the lower surfaces thereof, with a lead cutter including a die, and a cutting punch having a cutting edge at least on the surface facing said die, wherein the clearance between said die and said cutting punch is set within the range from not smaller than 2.3% and smaller than 14.0% of the total thickness of one of the leads to be cut and plated layers formed on the upper and the lower surfaces of said lead.

2. The method of fabricating a semiconductor device as claimed in claim 1, wherein the thickness of the plated layers formed on the upper and the lower surfaces of each of said leads is respectively 5 μm or smaller.

3. The method of fabricating a semiconductor device as claimed in claim 1, wherein said plated layers are composed of a lead-free solder.

4. The method of fabricating a semiconductor device as claimed in claim 1, wherein said plated layers are composed of nickel/gold, nickel/palladium, or nickel/palladium/gold.

* * * * *